United States Patent [19]

Masarik et al.

[11] Patent Number: 5,525,922
[45] Date of Patent: Jun. 11, 1996

[54] AUTOMATIC GAIN AND LEVEL CONTROL CIRCUIT AND METHOD

[75] Inventors: David M. Masarik, Laguna Beach; Robert S. Hayes, Lawndale, both of Calif.

[73] Assignee: Hughes Electronics, Los Angeles, Calif.

[21] Appl. No.: 318,567

[22] Filed: Oct. 5, 1994

[51] Int. Cl.[6] .............................. H03G 3/00; H03L 5/00
[52] U.S. Cl. .................... 327/179; 327/306; 327/339; 327/560; 330/278
[58] Field of Search ........................... 327/74, 76, 333, 327/339, 560, 306, 178, 179; 330/254, 278; 348/678

[56] References Cited

U.S. PATENT DOCUMENTS

| | | | |
|---|---|---|---|
| 3,145,379 | 8/1964 | Caspers | 327/76 |
| 3,281,530 | 10/1966 | Sennhenn | 327/333 |
| 4,229,703 | 10/1980 | Bustin | 330/9 |
| 4,451,797 | 5/1984 | Bains, Jr. | 330/278 |
| 4,573,033 | 2/1986 | Kolodin | 327/339 |
| 4,782,285 | 11/1988 | Bristol et al. | 327/306 |
| 5,302,860 | 4/1994 | Fischer et al. | 327/306 |

*Primary Examiner*—Timothy P. Callahan
*Assistant Examiner*—My-Trang N. V. Ton
*Attorney, Agent, or Firm*—Michael W. Sales; Wanda K. Denson-Low

[57] ABSTRACT

An automatic gain and level control output circuit. The inventive circuit (10) includes a first component (12) for multiplying an input signal by a first reference signal to provide a gain adjusted signal. The input signal is level shifted by a second reference signal by a second component (16) to provide a level adjusted signal. The gain and level adjusted signals are compared to third and fourth reference signals by third and fourth components (26 and 28), respectively. The outputs of the third and fourth components (26 and 28) are combined to provide a first signal. Either the output of the third component (26) or the fourth component (28) is selected to provide a second signal having a first or a second level respectively. The first signal is integrated to provide the first reference signal and the fourth signal is integrated to provide the second reference signal.

9 Claims, 3 Drawing Sheets

5,525,922

AUTOMATIC GAIN AND LEVEL CONTROL CIRCUIT AND METHOD

BACKGROUND OF THE INVENTION

1. Field of the Invention

The present invention relates to signal processing circuits and systems. More specifically, the present invention relates to circuits and systems for providing automatic gain and offset control.

2. Description of the Related Art

U.S. patent application Ser. No. 08/232,893, entitled LOW COST NIGHT VISION CAMERA, filed, by Apr. 12, 1994, S. H. Klapper et al., (Atty. Docket No. PD 94073), the teachings of which are incorporated herein by reference, discloses and claims a unique and advantageous camera having an array of uncooled detectors. The outputs of the detectors are processed by digital and analog circuits to provide an output signal suitable for display. U.S. patent applications Ser. No. 08/226/796, entitled ANALOG SIGNAL PROCESSING CIRCUIT FOR THERMAL INFRA-RED CAMERA, filed, Apr. 12, 1994, by D. Masarik et al., (Atty. Docket No. PD 94074) and Ser. No. 08,226,558, entitled Digital Signal Processing System for Removing DC Bias in The Output Of Pyroelectric and Similar Detectors, filed, Apr. 12, 1994, by D. Masarik et al., (Atty. Docket No. PD 94075), the teachings of which are also incorporated herein by reference, disclose and claim analog and digital processing circuits respectively which are useful in the processing of signals such as those provided by the above-referenced patent filed by S. H. Klapper et al. While these circuits have been found to be very useful in the processing of signals such as those provided by the night vision camera of Klapper et al., further improvements were afforded by the invention disclosed and claimed in U.S. patent application Ser. No. 08/271,600, entitled AUTOMATIC GAIN AND LEVEL CONTROL CIRCUIT AND METHOD, filed Jul. 7, 1994, by R. S. Hayes, (Atty. Docket No. PD 94062), the teachings of which are incorporated herein by reference. Hayes application provides a teaching of a circuit useful in the processing of signals input to analog-to-digital converters and the like. While this circuit provides automatic gain, offset and level control, it is intended primarily for input signals.

For these systems and many other applications, there is a need for a circuit which provides automatic gain, level and offset control for the output signals as well. For example, in the above-identified camera, a digital-to-analog converter (DAC) is the final output stage. However, optimally digital-to-analog converters also require input signals which are centered within a predetermined range. This is problematic with respect to visible and infrared video systems where DAC input signal levels may vary due to a variety of factors. Specifically, the alternate field inversion performed by a system using a pyroelectric detector results in a less than optimum output signal. In these systems the output signal must also be adjusted for gain and level.

Gain and level (or offset) control may be achieved by manual adjustment whenever the input signal changes. However, this solution has been found to be unacceptable in some applications inasmuch as it requires operator attention and skill, operator controls and wiring for same.

Previous automatic gain control systems sensed peak levels or average levels. Using peak levels allows a small number of extreme signal samples or picture elements to reduce the gain of the majority of the samples, resulting in a low contrast image. A system based on average signal levels may allow a substantial number of picture elements to exceed the dynamic range of the system, resulting in lost information.

Thus, a need remains in the art for a circuit or system for automatically adjusting the gain and level of signals produced by digital-to-analog converters or otherwise output from an electronic circuit.

SUMMARY OF THE INVENTION

The need in the art is addressed by the present invention which provides an automatic gain and level control output circuit. The inventive circuit includes a first component for multiplying an input signal by a first reference signal to provide a gain adjusted signal. The input signal is level shifted by a second reference signal by a second component to provide a level adjusted signal. The gain and level adjusted signals are compared to third and fourth reference signals by third and fourth components, respectively. The outputs of the third and fourth components are combined to provide a first signal. Either the output of the third component or the fourth component is selected to provide a second signal having a first or a second level respectively. The first signal is integrated to provide the first reference signal and the fourth signal is integrated to provide the second reference signal.

In the illustrative embodiment, the outputs of the third and fourth components are combined by a logical OR gate. In the illustrative embodiment, the sixth component for selecting the output of the third component to provide the fourth signal having the first level includes a first switch having a first terminal connected to a source of a first potential, a second terminal connected to the integrator, and a control terminal connected to receive the output of the third component. Similarly, the sixth component for selecting the output of the fourth component to provide the fourth signal having the second level includes a second switch having a first terminal connected to a source of a second potential, a second terminal connected to the integrator, and a control terminal connected to receive the output of the fourth component.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
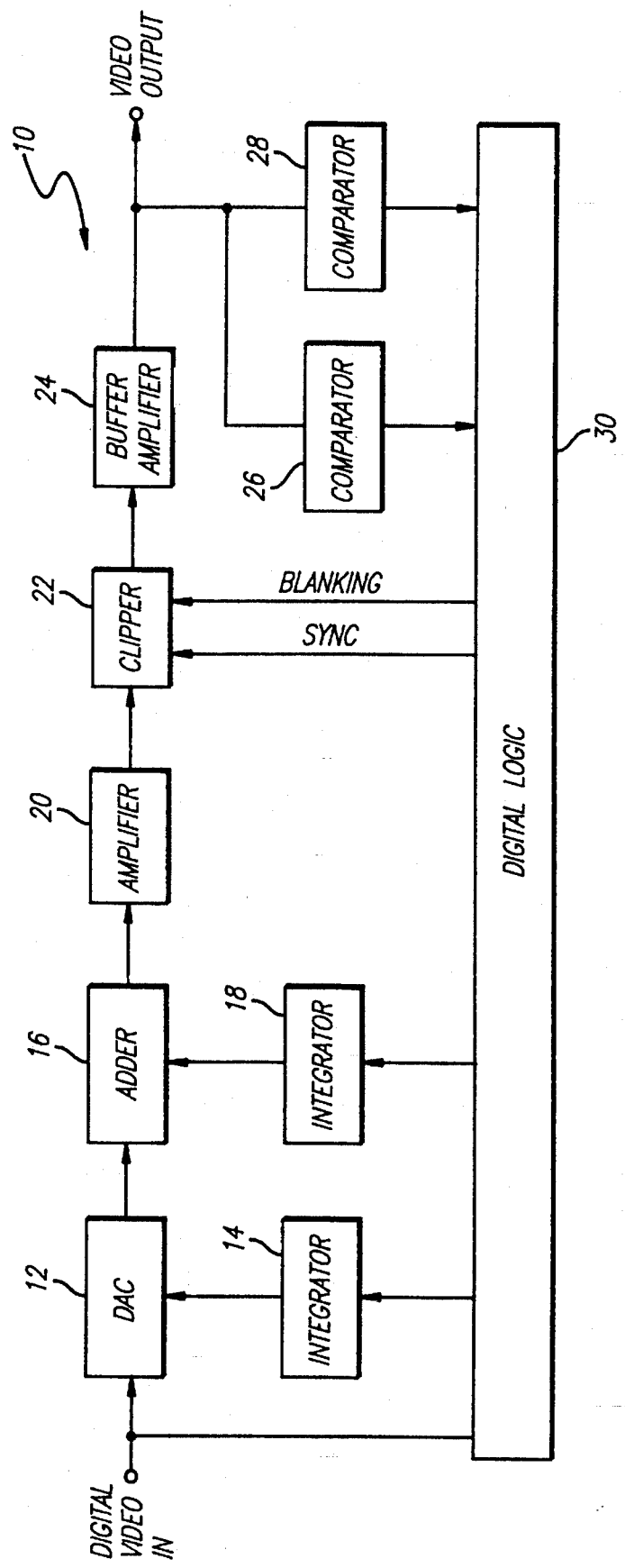
FIG. 1 is a block diagram of an illustrative implementation of the automatic gain and level control output circuit of the present invention.

FIG. 1 is a block diagram of an illustrative implementation of the automatic gain and level control output circuit of the present invention. The inventive circuit 10 includes a conventional digital-to-analog converter 12 for multiplying a digital video input signal by a first reference signal to provide a gain adjusted signal. The first reference signal is provided by a first conventional integrator 14. The gain adjusted input signal is level shifted by an adder circuit 16 to provide a level adjusted signal. The adder 16 adds the gain adjusted input signal to a second reference signal provided by a second conventional integrator 18.

The output of the adder 16 is connected to an amplifier 20. The output of the amplifier 20 is connected to a clipper circuit 22. The clipper circuit is connected to a buffer amplifier 24.

The amplified and clipped and gain and level adjusted signals are compared to third and fourth reference signals by first and second comparators 26 and 28, respectively. The outputs of the first and second comparators 26 and 28 are input to a digital logic circuit 30. The digital logic section provides the first and second reference signals for the first and second integrators 14 and 18, respectively. In addition, the digital logic circuit 30 provides sync and blanking pulses to the clipper circuit 22.

Figure 2:
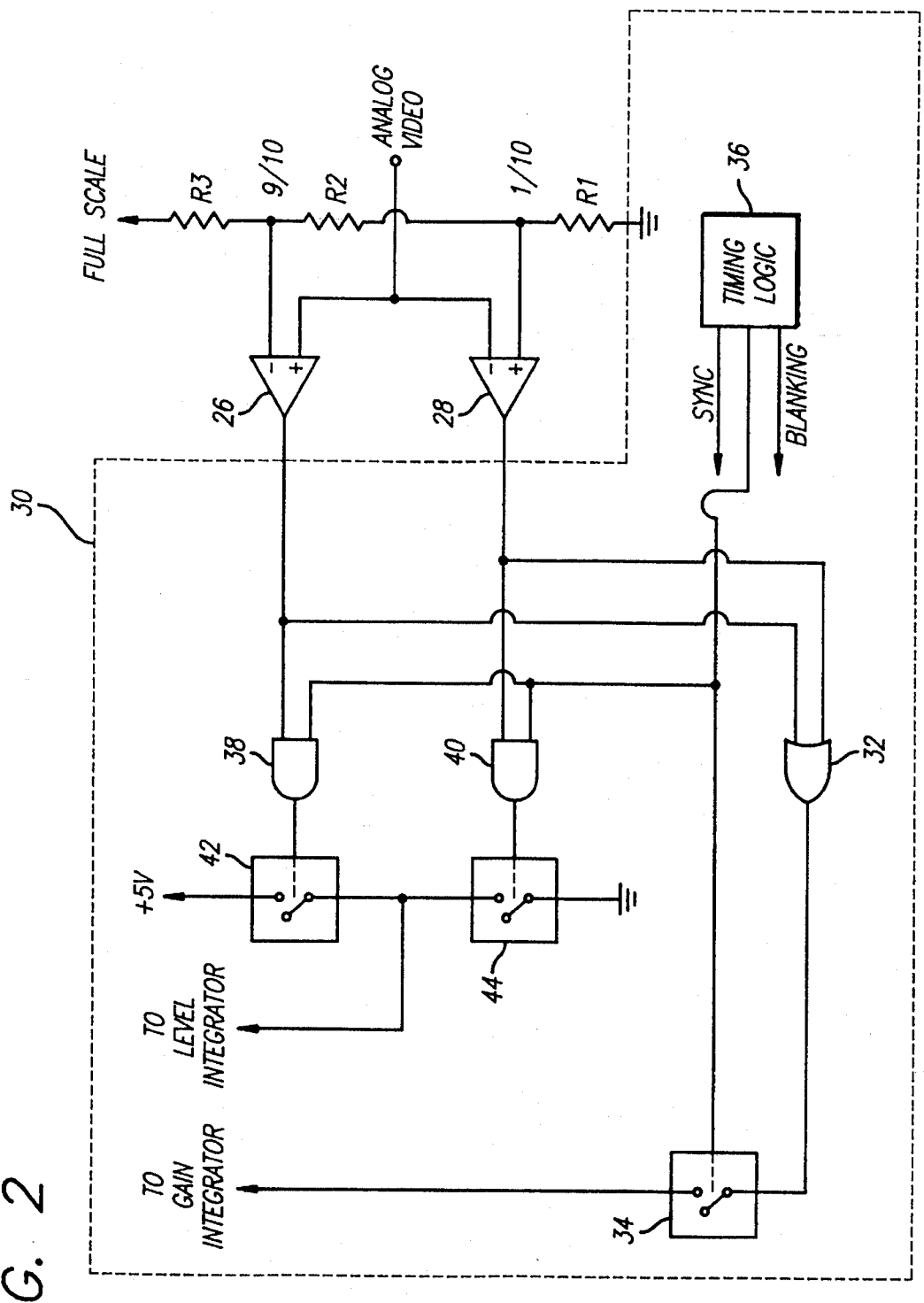
FIG. 2 is a simplified block diagram of the digital logic circuit of the automatic gain and level control output circuit of the present invention.

FIG. 2 is a simplified block diagram of the digital logic circuit of the automatic gain and level control output circuit of the present invention.

The outputs of the first and second comparators 26 and 28 are combined by a logical OR gate 32 and gated by a first switch 34 to provide a reference signal for the first integrator 14. The first switch 34 is controlled by a signal from a conventional timing logic circuit 36. The first switch 34 is closed during periods during when video signals are present and open during non-video periods such as sync and blanking intervals.

The output of the first comparator 26 or that of the second comparator 28 is selected by a first logical AND gate 38 or a second logical AND gate 40, respectively, to provide a reference signal for the second integrator 18 having a first or a second level respectively. The AND gates are enabled by a blanking pulse from the timing logic circuit 36. The blanking pulse is high during active video intervals and low during blanking and other inactive video intervals. The output of the first AND gate 38 controls a second switch 42. The second switch 42 has a first terminal connected to a source of supply potential. A second terminal thereof is connected to the second integrator 18. The output of the second AND gate 40 controls a third switch 44. The third switch 44 has a first terminal connected to a source of ground potential. A second terminal thereof is connected to the second integrator 18. The first, second and third switches may be implemented with transistors, transmission gates and other devices as will be appreciated by those skilled in the art.

The reference signal for the first integrator 14 is integrated to provide the first reference signal and the reference signal for the second integrator 18 is integrated to provide the second reference signal.

In operation, the video input signal arrives (typically from a digital logic section) in successive pixel values. These digital signals are converted to analog form by the DAC 12. The scale factor of these signals is varied by using the output of the first integrator 14 as the reference voltage for the DAC 12. The second integrator 18 serves to supply an offset voltage which is added to the DAC output in the adder 16. The output of the adder 16 is then amplified to the final output level desired by the amplifier 20. The video signal is then combined with sync and blanking pulses from the timing logic 36 of the digital logic section 30 using the clipper circuit 22. The clipper circuit 22 is arranged such that the most negative signal passes to its output.

Figure 3:
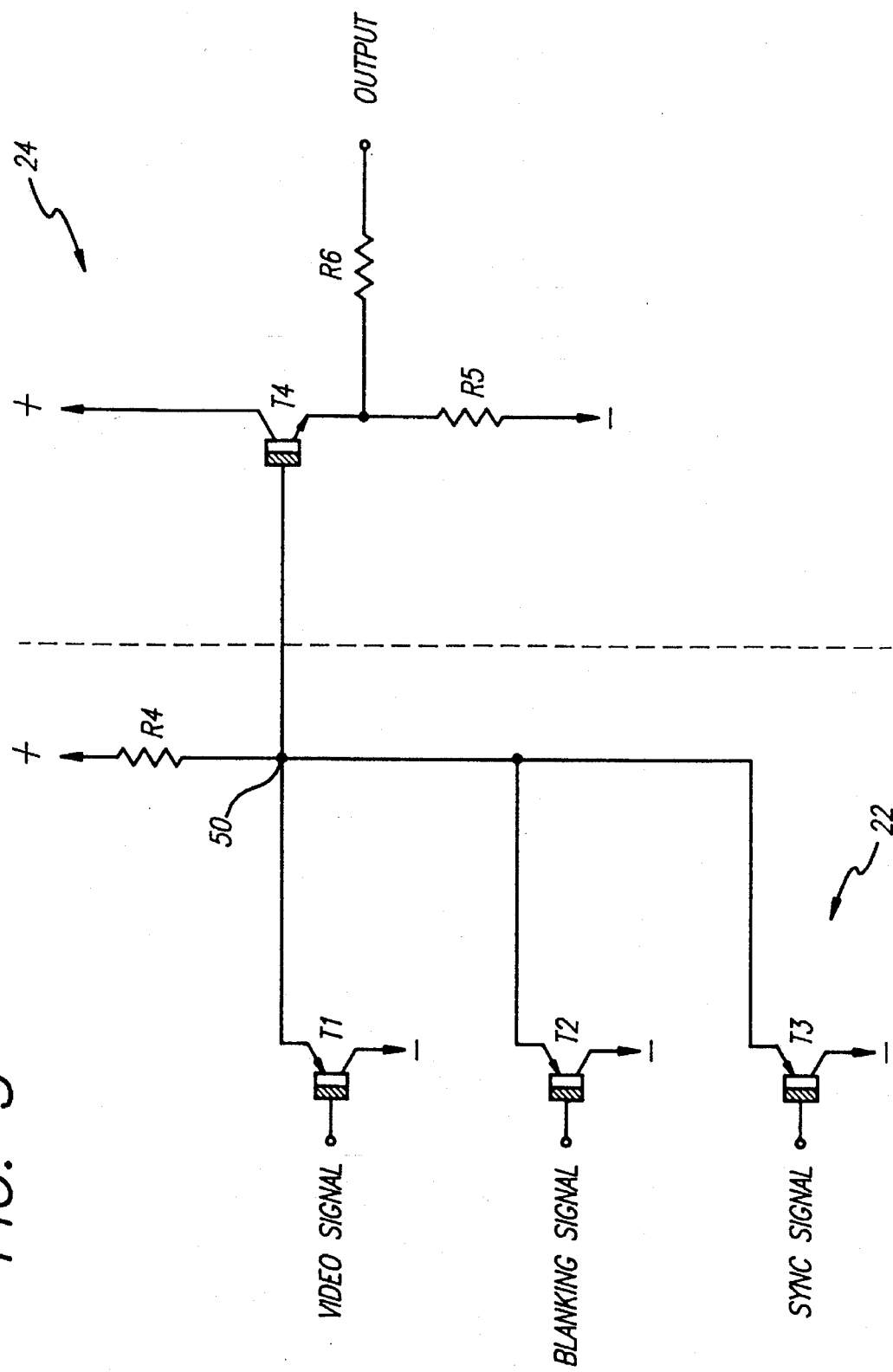
FIG. 3 is a schematic diagram of an illustrative implementation of a clipper circuit utilized in the automatic gain and level control output circuit of the present invention.

FIG. 3 is a schematic diagram of an illustrative implementation of a clipper circuit 22 utilized in the automatic gain and level control output circuit of the present invention. The clipper circuit 22 includes first, second and third transistors T1, T2 and T3 connected in parallel in emitter follower configurations. The first transistor T1 receives the video signal as its input. The second transistor T2 receives the blanking signal as its input. The third transistor T3 receives the sync signal as its input. The outputs of the three transistors are connected to a node 50 at which one end of a resistor R4 is connected. Since the other end of the resistor R4 is connected to a source of supply voltage, the resistor R4 is connected as a pullup resistor and serves as a load for the first, second and third transistors T1, T2, and T3. (The clipper circuit 22 may also be implemented with diode networks and amplifiers or other suitable means.)

The sync signal is adjusted such that its negative excursion is below the blanking and video signals and its positive excursion is above the video signal range. The blanking signal is adjusted such that its negative level is below the video range but above the negative sync level and its positive level is above the video signal range. When the sync signal is negative, the output is at the sync level regardless of the blanking and video signal levels. When the sync signal is positive and the blanking level is negative, the output is at the blanking level regardless of the video level. When both sync and blanking signals are positive, the output follows the video signal.

The output of the clipper circuit 22 is provided at the node 50 and is input the the buffer amplifier 24. The buffer amplifier may be implemented with a single transistor T4 in series with a resistor R5. The resistor R6 provides a termination for the transmission line. The buffer amplifier 24 provides the output current necessary to drive the load (typically 75 ohms) placed on the circuit. Feedback may be applied around the amplifier, clipper and buffer stages to control their overall gain.

The combined outputs of the first comparator 26 and the second comparator 28 provides a signal which indicates when the output is outside the middle portion of the video range. The individual outputs of the comparators indicate when the output falls outside two thresholds set near the limits of the video range.

The combined outputs of the comparators provides a window comparator. Its limits are set near the limits to the video range (typically 10% and 90% of the video range). Automatic gain control is effected by the first digital logic gate 38 which selectively passes the combined comparator outputs to the first (gain) integrator 14 under control of the blanking pulse from the timing logic 36. The output of the digital logic circuit 30 is open circuited during the blanking periods. It is low when the video signal is within the window (between the thresholds set by a voltage divider network comprising resistors R1, R2 and R3) and high when the video signal is outside the window. This signal is integrated by the first integrator 14 which is referenced to a voltage that is a fraction of the digital logic voltage (typically 10%). The output of the first integrator 14 varies the reference voltage of the DAC 12. This forms a feedback loop that reaches an equilibrium condition when 95% of the pixels fall between the 10% and 90% levels of the video range.

Automatic level control is effected by controlling the second and third digital logic gates 38 and 40 with the outputs of the first comparator 26 and the second comparator 28, respectively, and the blanking pulse from the timing logic circuit 36. The output of the digital logic circuit 30 is open circuited during the blanking periods. The output of the digital logic circuit 30 is low when the video output signal is below the lower threshold set by the voltage divider network and high when the video output signal is above the upper threshold. The output is open circuited when the video is between the two thresholds. This signal is integrated by the second integrator 18 which is referenced to a voltage midway between the high and low logic levels. The output of the second integrator 18 controls the offset added to the video signal. Hence, an equilibrium condition is established where 5% of the pixels are above the upper threshold level and 5% are below the lower threshold level.

The timing logic 30 provides the sync and blanking pulses needed to create a standard video signal and to provide an additional signal indicating the time intervals when actual video information is being output.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. An automatic gain and level control output circuit comprising:

first means for multiplying an input signal by a first reference signal to provide a gain adjusted signal;

second means for shifting a level of the gain adjusted signal in response to a second reference signal to provide a level adjusted signal;

third means for comparing the gain and level adjusted signals to a third reference signal to provide an output of said third means;

fourth means for comparing the gain and level adjusted input signals to a fourth reference signal to provide an output of said fourth means;

fifth means for combining the outputs of the third and fourth means to provide a first signal;

sixth means for selecting the output of the third means or the fourth means to provide a second signal having a first level or a second level respectively;

seventh means for integrating the first signal to provide the first reference signal; and eighth means for integrating the second signal to provide the second reference signal.

2. The invention of claim 1 wherein the first means is a digital to analog converter.

3. The invention of claim 1 wherein the second means is an adder.

4. The invention of claim 1 further including means for amplifying the gain and level adjusted signals.

5. The invention of claim 1 further including means for clipping the gain and level adjusting signals.

6. The invention of claim 1 wherein the means for combining the outputs of the third and fourth means is a logical OR gate.

7. The invention of claim 1 wherein the sixth means includes a first switch having a first terminal connected to a source of a first potential, a second terminal connected to the eighth means, and a control terminal connected to receive the output of the third means.

8. The invention of claim 1 wherein the sixth means includes a second switch having a first terminal connected to a source of a second potential, a second terminal connected to the eighth means, and a control terminal connected to receive the output of the fourth means.

9. A method for automatically adjusting the gain and level of an input signal including the steps of:

multiplying an input signal by a first reference signal to provide a gain adjusted signal;

shifting the level of the gain adjusted signal in response to a second reference signal to provide a level adjusted signal;

comparing the gain and level adjusted signals to a third reference signal to provide a first output;

comparing the gain and level adjusted input signal to a fourth reference signal to provide a second output;

combining the outputs provided by the third and fourth steps to provide a third signal;

selecting an output provided by the third step or said fourth step to provide a fourth signal having a first level or a second level respectively;

integrating the third signal to provide the first signal; and integrating the fourth signal to provide the second signal.

\* \* \* \* \*